United States Patent
Noordman et al.

(10) Patent No.: US 12,099,306 B2
(45) Date of Patent: Sep. 24, 2024

(54) METHOD FOR CONTROLLING A LITHOGRAPHIC SYSTEM

(71) Applicant: ASML Netherlands B.V., Veldhoven (NL)

(72) Inventors: Oscar Franciscus Jozephus Noordman, Eindhoven (NL); Antonius Theodorus Wilhelmus Kempen, Rosmalen (NL); Jan Bernard Plechelmus Van Schoot, Eindhoven (NL); Marinus Aart Van Den Brink, Moergestel (NL)

(73) Assignee: ASML Netherlands B.V., Veldhoven (NL)

( * ) Notice: Subject to any disclaimer, the term of this patent is extended or adjusted under 35 U.S.C. 154(b) by 452 days.

(21) Appl. No.: 17/441,168

(22) PCT Filed: Feb. 20, 2020

(86) PCT No.: PCT/EP2020/054446
§ 371 (c)(1),
(2) Date: Sep. 20, 2021

(87) PCT Pub. No.: WO2020/187522
PCT Pub. Date: Sep. 24, 2020

(65) Prior Publication Data
US 2022/0163895 A1    May 26, 2022

(30) Foreign Application Priority Data
Mar. 21, 2019  (EP) .................... 19164206

(51) Int. Cl.
*G03F 7/00* (2006.01)
(52) U.S. Cl.
CPC ...... *G03F 7/70033* (2013.01); *G03F 7/70425* (2013.01); *G03F 7/70558* (2013.01)
(58) Field of Classification Search
CPC ............. G03F 7/70033; G03F 7/70425; G03F 7/70558
USPC ......................................................... 430/30
See application file for complete search history.

(56) References Cited

U.S. PATENT DOCUMENTS

| 5,986,742 | A  | 11/1999 | Straaijer et al. |
| 6,633,831 | B2 | 10/2003 | Nikoonahad et al. |
| 8,653,437 | B2 | 2/2014  | Partlo et al. |
| 8,872,122 | B2 | 10/2014 | Schafgans et al. |
| 9,310,698 | B2 | 4/2016  | Menchtchikov et al. |
| 9,360,600 | B2 | 6/2016  | Pate et al. |
| 9,390,827 | B2 | 7/2016  | Partlo et al. |
| 9,693,440 | B1 | 6/2017  | Ershov |
| 2004/0179184 | A1 | 9/2004 | Levasier et al. |
| 2005/0195398 | A1 | 9/2005 | Adel et al. |
| 2013/0077073 | A1 | 3/2013 | Van Schoot et al. |
| 2016/0147161 | A1 | 5/2016 | Nikipelov et al. |
| 2017/0307977 | A1 | 10/2017 | Godfried et al. |
| 2018/0253014 | A1 | 9/2018 | Everts et al. |

FOREIGN PATENT DOCUMENTS

| EP | 1 788 451 A1 | 5/2007 |
| EP | 2 071 402 A2 | 6/2009 |
| JP | H04-025830 A | 1/1992 |
| JP | H09-219348 A | 8/1997 |
| JP | H11-233401 A | 8/1999 |
| WO | WO 2013/152878 A2 | 10/2013 |
| WO | WO 2014/202585 A2 | 12/2014 |

OTHER PUBLICATIONS

International Search Report and Written Opinion of the International Searching Authority directed to related International Patent Application No. PCT/EP2020/054446, mailed May 15, 2020; 11 pages.
International Preliminary Report on Patentability directed to related International Patent Application No. PCT/EP2020/054446, issued Sep. 16, 2021; 8 pages.
"Lithographic projection apparatus," Research Disclosure, vol. 518, No. 4, Jun. 1, 2007; 2 pages.
Robinson et al., "Characterization and control of EUV scanner dose uniformity and stability," Proc. SPIE, Extreme Ultraviolet (EUV) Lithography IX, vol. 10583, Apr. 4, 2018; 8 pages.

*Primary Examiner* — Christopher G Young
(74) *Attorney, Agent, or Firm* — Sterne, Kessler, Goldstein & Fox P.L.L.C.

(57) ABSTRACT

A lithographic system comprises a radiation source and a lithographic apparatus. The radiation source provides radiation to the lithographic apparatus. The lithographic apparatus uses the radiation for imaging a pattern onto multiple target areas on a layer of photo-resist on a semiconductor substrate. The imaging requires a pre-determined dose of radiation. The system is controlled so as to set a level of a power of the radiation in dependence on a magnitude of the pre-determined dose.

12 Claims, 2 Drawing Sheets

METHOD FOR CONTROLLING A LITHOGRAPHIC SYSTEM

CROSS-REFERENCE TO RELATED APPLICATIONS

This application claims priority of EP application 19164206.5 which was filed on Mar. 21, 2019 and which is incorporated herein in its entirety by reference.

FIELD

The present invention relates to a method for controlling a lithographic system. The invention also relates to a lithographic system, and to control software configured for use at the lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a semiconductor substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

An EUV lithographic system comprises a radiation source configured to generate EUV radiation and a lithographic apparatus configured to receive the EUV radiation from the lithographic source and to use the EUV radiation to image a pattern onto a substrate (i.e. a semiconductor wafer) provided with a photosensitive resist. The radiation source is typically of the laser-produced-plasma (LPP) source, wherein a high-power laser converts mass-limited fuel targets into plasma, one at the time. The plasma generates EUV. Accordingly, the EUV radiation is provided in a sequence of pulses, at a rate of, e.g., 50 kHz or 100 kHz. The lithographic apparatus may be a scanner, for example, in which each target area on the substrate may be irradiated by scanning the pattern to be imaged through a radiation beam in a given direction while simultaneously scanning the substrate parallel or anti-parallel to this direction. Generally, it is desirable to minimize the time taken to image the pattern onto the substrate so as to increase the throughput of the lithographic apparatus (i.e., the number of substrates per hour).

The amount of radiation energy delivered to a unit of surface area of the substrate is referred to as the dose. Typical magnitude of the dose lies in the range of, for example, 20 mJ/cm$^2$ to 70 mJ/cm$^2$. It is desirable to accurately control the dose of radiation delivered to the substrate.

SUMMARY

According to a first aspect of the invention, there is provided a method of controlling a lithographic system comprising a radiation source and a lithographic apparatus. The radiation source is configured to provide radiation to the lithographic apparatus. The radiation source is, e.g., of the type referred to as the LPP source. The lithographic apparatus is configured to use the radiation for imaging a pattern onto multiple target areas on a layer of photo-resist on a semiconductor substrate. The imaging requires a pre-determined dose of radiation. The method comprises setting a level of a power of the radiation in dependence on a magnitude of the pre-determined dose Up till now, lithographic systems have been operated using a fixed time-averaged energy level of the source. This energy level is chosen so as to be suitable for all possible photoresists. In other words, the average energy level is chosen to be suitable for even the photoresist of highest sensitivity. The inventors have realized that, in practice, this results in the chosen energy level being lower than necessary for most applications. It has been found that, by setting the time-averaged energy level (power level) in dependence on the desired dose, the operating power of the radiation source may be optimized so as to maximize the throughput. The method of the invention is advantageous because, by controlling the operating power of the radiation source in dependence on the dose required, the throughput of the lithographic system, i.e., the number of substrates that are processed per unit of time, can be optimized. As will be explained in further detail below, the dose is proportional to the ratio of the (time-averaged) energy per pulse from the radiation source, and the scan speed of the scanner. Throughput of the scanner (the time it takes for the scanner to handle a substrate) increases with increasing scan speed. In order to keep the dose equal to the required magnitude, the energy per pulse is then to be increased as well. However, increasing the energy may lead to instabilities in the energy produced by the radiation source. Sometimes, the radiation source provides insufficient energy to the target area being scanned. Such target area will then need to be subjected to a re-exposure in a second pass of the substrate through the scanner, as the first pass did not deliver the required amount of energy. Such second pass is also referred to as a "die-repair". Accordingly, with higher energy per unit of time (i.e., with higher power) of the radiation source, the number of instabilities will generally increase, giving rise to the need for a second pass with an increased number of die-repairs. Therefore, setting the power of the radiation source in dependence on the required dose enables to find an optimum between high scan speed for exposure and the number of die-repairs needed as a result of the power level set, so as to maximize the scanner's throughput.

In an embodiment of the method of the invention a total length of time for the imaging onto the multiple target areas includes: a first length of time for the imaging onto the multiple target areas in a first pass of the semiconductor substrate; and a second length of time for the imaging onto one or more specific ones of the multiple target areas in a second pass of the semiconductor substrate, the one or more specific target areas having failed to receive the pre-determined dose in the first pass. The method comprises setting the level of the power of the radiation so as to keep the total length of time substantially at, or near, a minimum value. There is a chance that, during a first pass of the substrate, one or more target areas of the substrate receive an actual dose of radiation which is less than the desired dose. This can be compensated for by a second, subsequent exposure pass (i.e., so-called die-repair or re-expose pass). The total throughput of the lithographic system is dependent on the sum of the time taken for the initial exposure and the time taken for the second, subsequent exposure (i.e., for die-repair). The inventors have realized that by controlling the operating power of the radiation source in dependence on the required dose the total time taken to fully expose the substrate may be minimized.

In an embodiment, the method further includes: during the first pass, recording for each respective one of the one or more specific target areas information representative of a respective location on the substrate, and a respective difference between the pre-determined dose and a dose actually received; during the second pass, imaging onto the one or more specific ones of the multiple target areas under control of the information recorded.

During the imaging, the amount of energy received per target area is being logged via appropriate sensors, as well as the identity of the one or more specific target areas. As known in the art, the identities of the target areas are derived from the so-called wafer grid. The wafer grid determines the coordinates of the locations of the target areas of the substrate in the exposure plane. The wafer grid is determined by the alignment marks embedded in the substrate. Proper alignment of a substrate with respect to the projection optics is performed by an alignment system. For example, a number of alignment marks on the substrate are measured to derive a co-ordinate system, which is compared to a modeled grid to derive the positions of features on the substrate. However, clamping of the substrate on the substrate table, or wafer distortion occurring in non-lithography process steps, may cause distortion of the substrate, which can be monitored by comparison of the measurements to the grid. Models describing the wafer grid may be created, which are used in exposing substrates so as to compensate for the distortions. See, e.g., U.S. Pat. No. 9,310,698 issued to Menchtchikov et al., assigned to ASML and incorporated herein by reference.

It will be appreciated that as used in this context minimizing the sum of the first time period and the second time period is intended to mean achieving a sum of the first time period and the second time period that is at, or is close to (for example within 10% of, preferably within 2% of, particularly preferably within 1% of), the true minimum.

For a larger desired dose, the energy level set may be substantially higher, such that the nominal operating power of the radiation source is closer to the maximum power, than if a smaller dose is desired, in which case the energy level set may be substantially lower. As discussed above, the dose may be delivered via a series of pulses in an EUV LPP source. If a greater total dose is desired, a larger number of pulses may be delivered to a target area on the substrate than if a smaller dose is desired. The number of pulses to be delivered to a target area may be used to determine the energy level. For example, the number of pulses may be converted into a particular energy level using a look-up table or another mathematical model.

A further embodiment of the method in the invention comprises estimating in advance a number of the specific target areas in dependence on the level of the power and on the magnitude of the required dose. This can be implemented via a mathematical model, e.g., implemented in a look-up table or an algorithm, that predicts or, otherwise determines or estimates, the number of target areas, which will need a re-exposure in the second pass, in dependence on the source power set and for a given dose. Such model or look-up table may be prepared in advance by monitoring the instabilities in the power delivered by the radiation source for a variety of controlled energy levels as set, or may be derived from simulations.

The invention also relates to a lithographic system comprising a radiation source and a lithographic apparatus. The radiation source is configured to provide radiation to the lithographic apparatus and is, for example of, an EUV LPP type. The lithographic apparatus is configured to use the radiation for imaging a pattern onto multiple target areas on a layer of photo-resist on a semiconductor substrate. The imaging requires a pre-determined dose of radiation. The system is configured to set a level of a power of the radiation in dependence on a magnitude of the pre-determined dose.

In an embodiment of the lithographic system, a total length of time for the imaging onto the multiple target areas includes: a first length of time for the imaging onto the multiple target areas in a first pass of the semiconductor substrate; and a second length of time for the imaging onto one or more specific ones of the multiple target areas in a second pass of the semiconductor substrate, the one or more specific target areas having failed to receive the pre-determined dose in the first pass. The lithographic system is configured to set the level of the power of the radiation so as to keep the total length of time substantially at, or near, a minimum value.

In a further embodiment, the lithographic system is configured to record, during the first pass, for each respective one of the one or more specific target areas information representative of a respective location at the semiconductor substrate and a respective difference between the pre-determined dose and a dose actually received; and to control, during the second pass, the imaging onto the one or more specific ones of the multiple target areas under control of the information recorded.

In a further embodiment, the lithographic system is configured to estimate in advance a number of the specific target areas in dependence on the level of the power and on the magnitude of the required dose.

In a further embodiment, the radiation source is operative to supply EUV radiation and is of a laser-produced plasma type.

The invention further relates to control software configured for use at a lithographic system that comprises a radiation source and a lithographic apparatus. The control software may be provided on a data carrier or on another machine-readable medium. Alternatively, the control software may be provided via a data network, e.g., for downloading on the lithographic system. The radiation source is configured to provide radiation to the lithographic apparatus. The lithographic apparatus is configured to use the radiation for imaging a pattern onto multiple target areas on a layer of photo-resist on a semiconductor substrate. The imaging requires a pre-determined dose of radiation. The control software comprises: first instructions configured to receive data representative of a magnitude of the pre-determined dose; and second instructions configured to set a level of a power of the radiation in dependence on the magnitude of the pre-determined dose.

In an embodiment of the control software, a total length of time for the imaging onto the multiple target areas includes: a first length of time for the imaging onto the multiple target areas in a first pass of the semiconductor substrate; and a second length of time for the imaging onto one or more specific ones of the multiple target areas in a second pass of the semiconductor substrate, the one or more specific target areas having failed to receive the pre-determined dose in the first pass. The control software comprises third instructions configured to set the level of the power of the radiation so as to keep the total length of time substantially at, or near, a minimum value.

In an embodiment, the control software comprises fourth instructions configured to record, during the first pass, for each respective one of the one or more specific target areas information representative of a respective location at the semiconductor substrate and a respective difference between the pre-determined dose and a dose actually received; and fifth instructions configured to control, during the second pass, the imaging onto the one or more specific ones of the multiple target areas under control of the information recorded.

A further embodiment comprises sixth instructions configured to estimate in advance a number of the specific target areas in dependence on the level of the power and on the magnitude of the required dose. The sixth instructions comprise seventh instructions for accessing a mathematical model, e.g., an algorithm or a look-up table, configured to generate the number.

A benefit for a typical dose (e.g., 40 mJ/cm$^2$) is that the EUV radiation source can operate at an approximately 5% higher power than at a power level for 20 mJ/cm$^2$—with up to 0.5% re-exposure. This results in an increase in throughput of about 3.5% substrates per hour at a dose of 40 mJ/cm$^2$.

BRIEF DESCRIPTION OF THE DRAWINGS

Embodiments of the invention will now be described, by way of example only, with reference to the accompanying schematic drawings, in which.

DETAILED DESCRIPTION

Figure 1:
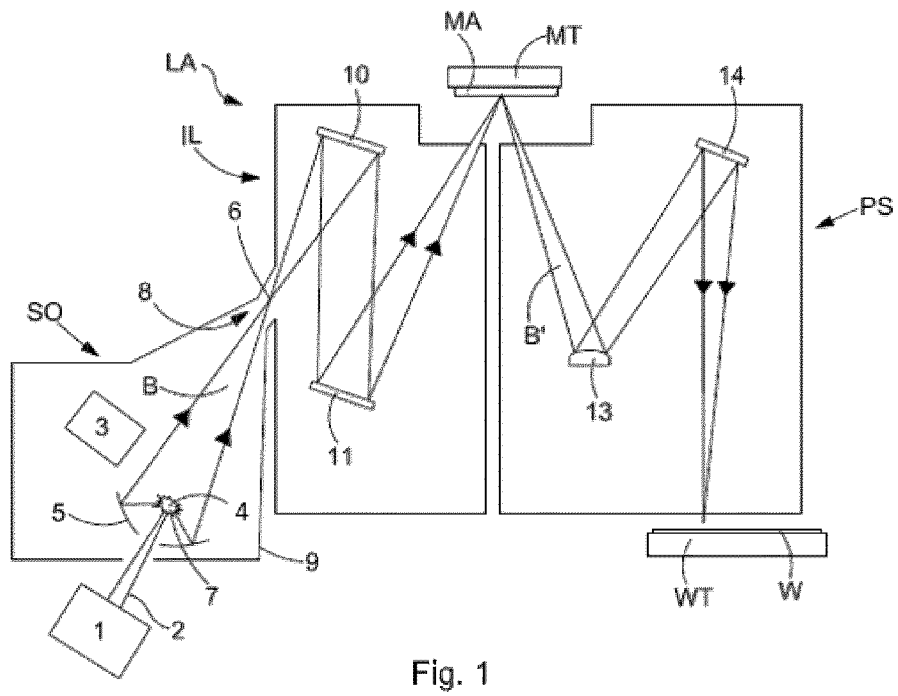
FIG. 1 schematically depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser-produced plasma (LPP) source. A laser system 1, which may, for example, include a CO2 laser, is arranged to deposit energy via a laser beam 2 into a mass-limited target of fuel (e.g., a droplet), such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at the intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser-produced plasma (LPP) source, any suitable source such as a discharge produced plasma (DPP) source or a free electron laser (FEL) may be used to generate EUV radiation.

As mentioned above, mass-limited fuel targets ("droplets") are converted, one after the other, into plasma. This process may happen at a frequency of, e.g., 50 kHz or 100 kHz. The EUV radiation beam B therefore consists of a temporal sequence of discrete EUV pulses. Now consider the lithographic apparatus LA, that is being used in the so-called scanning mode. In the scanning mode, the mask MA and the substrate W are scanned synchronously while a pattern imparted to the radiation beam B is projected onto a target area of the substrate W. The velocity and direction of the substrate W relative to the mask MA may be determined by the (de-)magnification and image reversal characteristics of the projection system PS. The total amount of radiation energy delivered by the lithographic apparatus LA to a unit of surface area on the surface of the substrate W is referred to as the "dose". The desired dose is to achieve a change or curing of a layer of photoresist on the surface of the substrate W. The desired dose may differ depending on the sensitivity of the photoresist. For example, in the case of a highly sensitive photoresist, a relatively small dose (e.g. 20 mJ/cm$^2$) may be desired in order to image the pattern onto the substrate W. However, in the case of a less sensitive photoresist, a larger dose (e.g. 70 mJ/cm$^2$) may be desired.

If a target area on a substrate W receives a dose which differs from the desired dose, this is referred to as a dose error. In particular, the dose error is the difference between the actual dose received by a target area and the desired dose. A dose error may be 'positive' (i.e. in the event that a target area receives a larger dose than the desired dose) or 'negative' (i.e. in the event that a target area receives a smaller dose than the desired dose). Any dose error will result in some printing errors in the photo-sensitive resist. A negative dose error may be corrected by providing an additional dose in order to compensate the previous shortfall. However, it may not be possible to correct a positive dose error since an excessive dose (e.g. leading to overexposure) has already been given, the change in the photoresist generally being irreversible. This may result in irreparable damage to the substrate W.

It will be appreciated that a certain level of positive dose error may be considered to be acceptable in accordance with manufacturing tolerances. For example, a positive dose error of up to 1%, in particular up to 0.5% may be considered to be acceptable, depending on requirements. An excessive dose as referred to herein means a dose which falls outside of the acceptable tolerance level.

As previously mentioned, the radiation beam delivers the energy of the EUV radiation in pulses to the target area that is being exposed while the target area is being scanned. That is, the energy that a unit of surface area of the target area receives, i.e., the dose, equals the sum of the energy of the individual pulses incident on that unit of surface area that is being scanned. The number of pulses delivered to a target area on the substrate W will be dependent on, among other things, the operating power of the radiation source SO, and the scan speed. As to the role of the scan speed, it is remarked here that the EUV radiation reaches the substrate W via a slit, underneath which the substrate is traveling. The substrate W accommodates a plurality of target areas, each thereof having a length "l" and a width "w". During exposure of a target area (or: a "die") the substrate W is traveling in a direction parallel to the length "l" of the target area with a relative speed "v". The time Tscan it takes to expose the target area equals l/v. If the radiation source SO delivers the energy at a rate of N pulses per second, the area l·w receives a number of pulses equal to N·Tscan=N·(l/v). If each pulse had a constant energy of E, then the energy received by the area l·w would have been N·(l/v)·E. As the parameter "dose" is defined as the energy received per unit area, the dose delivered would have been N·(l/v)·E/(w·l)=N·E/(v·w). Accordingly, the dose can be adjusted via control of at least one of: the pulse rate, the energy per pulse and the scan speed. A given dose level is determined by the ratio E/v. In order to maximize the scan speed, and therefore the throughput of the lithographic apparatus for a given dose level, one needs to maximize the energy per pulse so as to keep the ratio constant.

In reality, the energy of an EUV pulse may vary from pulse to pulse. This may be due to variation in size or speed of the fuel droplets, to variation in laser pulse timing, etc. Therefore, the energy of each EUV pulse is tracked. To this end, one or more EUV sensors may be accommodated in the enclosing structure 9 that are configured to sense the EUV generated per pulse. For more background, please see, e.g., U.S. Pat. No. 9,360,600, issued to Pate et al., assigned to ASML and incorporated herein by reference. The radiation source SO is operated with a so-called dose margin that controllably sets the level of energy of the EUV generated, averaged over a particular length of time (also referred to as: controlled energy or power), below the source's maximum output power (also referred to as: open-loop energy). A non-zero dose margin enables to compensate for temporally short drops in EUV energy, e.g., by adjusting the duration of one or more pulses, or by adjusting the energy of one or more laser pulses fired on one or more of the next fuel droplets. For more information on dose control, please see, e.g., U.S. Pat. No. 9,693,440, issued to Ershov and assigned to ASML, and U.S. Pat. No. 8,872,122, issued to Schafgans et al., and assigned to ASML, both US patents incorporated herein by reference. Also see, US patent application publication 20180253014, filed for Everts et al., assigned to ASML and incorporated herein by reference. Further see, e.g., U.S. Pat. Nos. 8,653,437 and 9,390,827, both issued to Partlo et al., assigned to Cymer, a subsidiary of ASML, and incorporated herein by reference.

In case too many consecutive EUV pulses deliver too low an energy to the substrate's exposed target area, the eventual dose delivered to the target area may be too low. Such dose drops and associated target areas are logged. This information is then used to expose such areas in a second pass of the substrate in order to correct the dose for those areas.

For a given operating power, a more sensitive photoresist may receive fewer pulses than a less sensitive photoresist in order to obtain the desired dose so as to image the pattern onto the substrate W. In practice, the output of a pulsed radiation source SO will vary with time. If the energy of an individual pulse is higher or lower than a nominal or desired output energy for each pulse then this will contribute to a dose error. The fewer pulses received by a target area, the greater the effect of such an individual pulse energy error will be on the total dose.

If the dose margin is made smaller and, therefore, if the radiation source SO is operating closer to maximum power, then the time to expose a single substrate can be decreased if the scan speed is increased. However, operating the source SO with closer to maximum power also increases the chance of having to re-expose certain target areas of the substrate W in a second pass. The reason for this is that there is not always enough energy available in the limited number of subsequent EUV pulses incident on the target area in order to compensate for a drop in EUV energy delivered by preceding EUV pulses to that target area. Accordingly, the total time Ttotal it takes to successfully complete the exposure of a substrate W is the expose-time Texpose needed to expose the substrate W in a first pass plus the re-expose-time Tre-expose needed to run the re-exposures in a second pass of the substrate W to deliver the missing dose(s).

Both parameters Texpose and Tre-expose depend on the scan speed v and on the dose margin (or, in other words: depend on the level of the controlled energy as set), given the dose required. The parameter Texpose turns out to be a monotonically decreasing function of the controlled energy, whereas the parameter Tre-expose turns out to be a non-linear monotonically increasing function of the controlled energy. Accordingly, there is a minimum magnitude of the total time Ttotal as a function of the controlled energy, namely for that level of the controlled energy for which sum of the derivatives [δTexpose/δ controlled energy] and [δTre-expose/δ controlled energy] equals zero. Setting the controlled energy at, or around, that level, given the dose N·E/(v·w) required, will generally minimize the throughput time per substrate W. For this, it is required that one has information on how the number of re-exposures per wafer changes with a change in controlled energy. This has been determined and modeled, e.g., by monitoring the output of the radiation source SO for various levels of controlled energy, so as to be able to profile the behavior of the radiation source. The above is illustrated in the diagrams of FIGS. 2 and 3.

Figure 2:
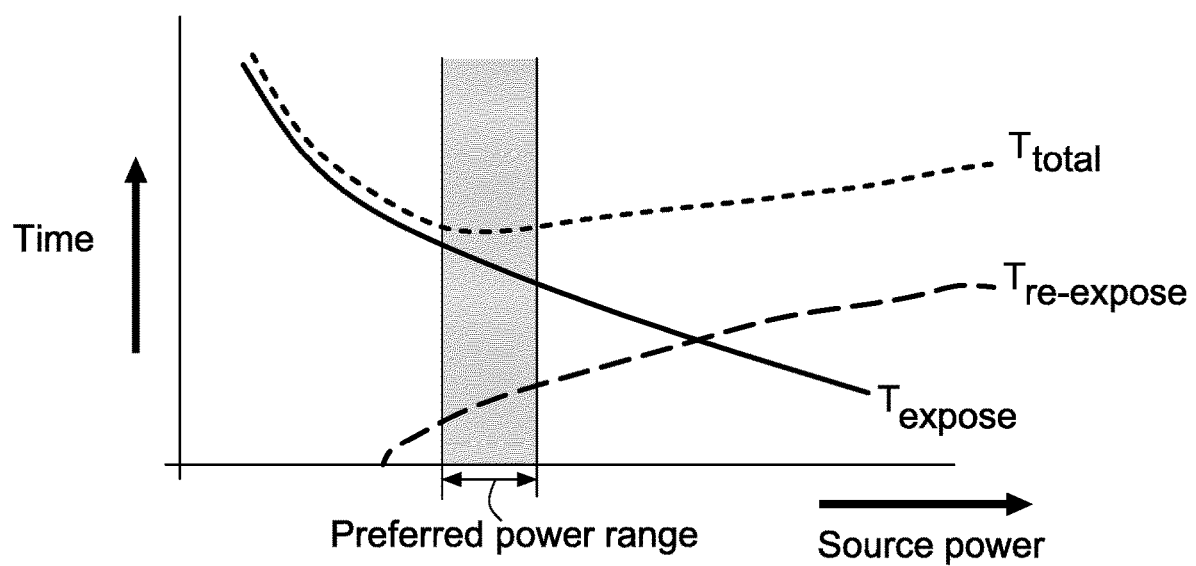
FIG. 2 is a diagram illustrating the total time required, as a function of the source power, for exposing a substrate including die-repairs, given the dose.

The diagram of FIG. 2 gives the curve T expose illustrating the time needed for the exposure of the substrate W with a given dose as a function of the source power, if there are no instabilities. As the instabilities in the source power increase with increasing power, the number of die-repairs increases as well. The curve Tre-expose illustrates the time needed to re-expose the substrate W as a function of the source power. The curve Ttotal is then the sum of the time needed for exposure and the time needed for re-exposure, as a function of the source power.

Figure 3:
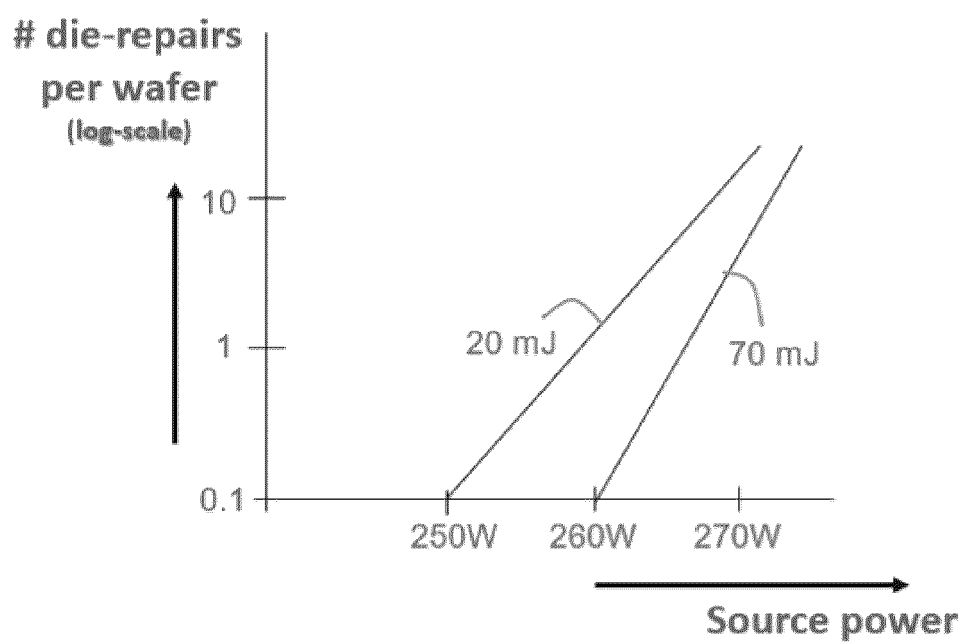
FIG. 3 is a diagram illustrating the number of estimated die-repairs per substrate as a function of the source power, for two dose levels.

The diagram of FIG. 3 illustrates for two different dose levels, 20 mJ/cm² and 70 mJ/cm², the estimated number of die-repairs needed per substrate (wafer) as a function of the source power.

Summarizing: if scan speed v is increased, throughput can be increased. However, for a given dose, i.e., for a given ratio of E/v, the average energy E is then to be increased as well in order to keep the ratio constant. Increasing the average energy E, i.e., reducing the dose margin, leads to more instabilities that require more die-repairs, i.e., that require a longer second pass of the substrate for the re-exposure. The inventors propose to set the energy level E in a range that lowers the total time Ttotal, the energy E then determining the scan speed v via the given magnitude of the required dose E/v. In the second pass, the missing dose is supplied to the target areas that received the incomplete dose in the first pass. The missing dose may be controlled by a change in E, a change in v or in both. See, e.g., U.S. Pat. Nos. 8,653,437 and 9,390,827, referred to above.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of controlling a lithographic system comprising a radiation source and a lithographic apparatus, wherein:

the radiation source is configured to provide radiation to the lithographic apparatus;

the lithographic apparatus is configured to use the radiation for imaging a pattern onto multiple target areas on a layer of photo-resist on a semiconductor substrate;

the imaging requires a pre-determined dose of radiation; and the method comprises setting a level of a power of the radiation in dependence on a magnitude of the pre-determined dose, wherein:

a total length of time for the imaging onto the multiple target areas includes:

a first length of time for the imaging onto the multiple target areas in a first pass of the semiconductor substrate; and a second length of time for the imaging onto one or more specific ones of the multiple target areas in a second pass of the semiconductor substrate, the one or more specific target areas having failed to receive the pre-determined dose in the first pass, and wherein the method comprises:

setting the level of the power of the radiation so as to minimize the total length of time for the imaging onto the multiple target areas.

2. The method of claim 1, comprising:

during the first pass, recording, for each respective one of the one or more specific target areas, information representative of a respective location at the semiconductor substrate and a respective difference between the pre-determined dose and a dose actually received; and during the second pass, imaging onto the one or more specific ones of the multiple target areas under control of the information recorded.

3. The method of claim 1, comprising estimating in advance a number of the one or more specific target areas in dependence on the level of the power and on the magnitude of the required pre-determined dose.

4. The method of claim 1, wherein the radiation source is operative to supply laser-produced plasma EUV radiation.

5. A lithographic system comprising a radiation source and a lithographic apparatus, wherein:
the radiation source is configured to provide radiation to the lithographic apparatus;
the lithographic apparatus is configured to use the radiation for imaging a pattern onto multiple target areas on a layer of photo-resist on a semiconductor substrate;
the imaging requires a pre-determined dose of radiation;
the system is configured to set a level of a power of the radiation in dependence on a magnitude of the pre-determined dose, and wherein:
a total length of time for the imaging onto the multiple target areas includes:
a first length of time for the imaging onto the multiple target areas in a first pass of the semiconductor substrate; and
a second length of time for the imaging onto one or more specific ones of the multiple target areas in a second pass of the semiconductor substrate, the one or more specific target areas having failed to receive the pre-determined dose in the first pass, and wherein:
the lithographic system is configured to set the level of the power of the radiation so as to keep the total length of time substantially at, or near, a minimum value.

6. The lithographic system of claim 5, further configured to:
during the first pass, record for each respective one of the one or more specific target areas information representative of a respective location at the semiconductor substrate and a respective difference between the pre-determined dose and a dose actually received; and
during the second pass, image onto the one or more specific ones of the multiple target areas under control of the information recorded.

7. The lithographic system of claim 5, further configured to estimate in advance a number of the one or more specific target areas in dependence on the level of the power and on the magnitude of the required pre-determined dose.

8. The lithographic apparatus of claim 5, wherein the radiation source is operative to supply laser-produced plasma EUV radiation.

9. A non-transitory computer program product, for use at a lithographic system that comprises a radiation source and a lithographic apparatus, comprising machine-readable instructions for causing a processor to control a lithography method, the method comprising:
providing radiation from the radiation source to the lithographic apparatus;
controlling the lithographic apparatus to use the radiation to image a pattern onto multiple target areas on a layer of photo-resist on a semiconductor substrate, wherein the imaging requires a pre-determined dose of radiation;
receiving data representative of a magnitude of the pre-determined dose; and
setting a level of a power of the radiation in dependence on the magnitude of the pre-determined dose, and wherein:
a total length of time for the imaging onto the multiple target areas includes:
a first length of time for the imaging onto the multiple target areas in a first pass of the semiconductor substrate; and
a second length of time for the imaging onto one or more specific ones of the multiple target areas in a second pass of the semiconductor substrate, the one or more specific target areas having failed to receive the pre-determined dose in the first pass; and
setting the level of the power of the radiation so as to minimize the total length of time for the imaging onto the multiple target areas.

10. The non-transitory computer program product of claim 9, further comprising:
recording, during the first pass, for each respective one of the one or more specific target areas information representative of a respective location at the semiconductor substrate and a respective difference between the pre-determined dose and a dose actually received; and
controlling, during the second pass, the imaging onto the one or more specific ones of the multiple target areas under control of the information recorded.

11. The non-transitory computer program product of claim 9, further comprising estimating in advance a number of the one or more specific target areas in dependence on the level of the power and on the magnitude of the required pre-determined dose.

12. The non-transitory computer program product of claim 11, further comprising accessing a mathematical model configured to generate the number of the one or more specific target areas.

* * * * *